(12) United States Patent
Choi et al.

(10) Patent No.: US 10,497,720 B2
(45) Date of Patent: Dec. 3, 2019

(54) DISPLAY DEVICE

(71) Applicant: SAMSUNG DISPLAY CO., LTD., Yongin-si, Gyeonggi-do (KR)

(72) Inventors: Jun Won Choi, Cheonan-si (KR); Chang Soo Pyon, Seongnam-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 103 days.

(21) Appl. No.: 15/600,909

(22) Filed: May 22, 2017

(65) Prior Publication Data
US 2017/0358605 A1 Dec. 14, 2017

(30) Foreign Application Priority Data

Jun. 8, 2016 (KR) .......................... 10-2016-0071257

(51) Int. Cl.
*H01L 27/12* (2006.01)
*H01L 27/32* (2006.01)

(52) U.S. Cl.
CPC ........ *H01L 27/124* (2013.01); *H01L 27/1255* (2013.01); *H01L 27/3272* (2013.01); *H01L 27/3276* (2013.01)

(58) Field of Classification Search
None
See application file for complete search history.

(56) References Cited

U.S. PATENT DOCUMENTS

| | | | | |
|---|---|---|---|---|
| 2014/0132584 | A1* | 5/2014 | Kim | ..................... G09G 3/3696 345/212 |
| 2014/0292622 | A1 | 10/2014 | Lee | |
| 2016/0043159 | A1* | 2/2016 | Kim | ................... H01L 27/3262 257/71 |
| 2016/0064700 | A1* | 3/2016 | Pyon | ................... H01L 27/3258 257/40 |

FOREIGN PATENT DOCUMENTS

| EP | 2983205 A1 | 2/2016 |
|---|---|---|
| EP | 2991117 A1 | 3/2016 |

OTHER PUBLICATIONS

Extended European Search Report dated Oct. 17, 2017, of the corresponding European Patent Application No. 17174235.6.

* cited by examiner

*Primary Examiner* — Bo B Jang
(74) *Attorney, Agent, or Firm* — Kile Park Reed & Houtteman PLLC

(57) ABSTRACT

A display device includes a driving gate electrode, a scan line separate from the driving gate electrode, a data line, a driving voltage line, and a semiconductor area including a first channel region overlapping the driving gate electrode and a shielding area overlapping the first data line. The display device also has a control line which includes a main line portion and a detour portion. The main line portion and the detour portion extend in different directions, and the semiconductor area includes a second channel region overlapping the first portion of the detour portion.

18 Claims, 15 Drawing Sheets

DISPLAY DEVICE

CROSS-REFERENCE TO RELATED APPLICATION

Korean Patent Application No. 10-2016-0071257, filed on Jun. 8, 2016, and entitled, "Display Device," is incorporated by reference herein in its entirety.

BACKGROUND

1. Field

One or more embodiments described herein relate to a display device.

2. Description of the Related Art

One type of display has pixels that emit light using organic light emitting diodes. Each diode includes an organic emission layer between an anode and cathode. Electrons injected from the cathode and holes injected from the anode recombine in the organic emission layer form excitons. Light is emitted when the excitons change state.

Each organic light emitting diode is controlled by a pixel circuit, which includes at least a switching transistor and a driving transistor. The switching transistor operates, based on a scan signal, to transfer a voltage corresponding to a data signal to the driving transistor. The driving transistor is directly or indirectly connected to the organic light emitting diode, to control the amount of a current transmitted to the organic light emitting diode. The capacitor is connected to a driving gate electrode of the driving transistor to maintain a voltage of the driving gate electrode.

SUMMARY

In accordance to one or more embodiments, a display device includes a driving gate electrode; a scan line separate from the driving gate electrode and extending in a first direction; a first data line to transmit a data signal, the first data line crossing the scan line; a driving voltage line to transmit a driving voltage, the driving voltage line crossing the scan line; a semiconductor area including a first channel region overlapping the driving gate electrode and a shielding area overlapping the first data line; and a control line including a main line portion and a detour portion, the main line portion extending in the first direction and the detour portion including a first portion extending in a second direction crossing the first direction, wherein the semiconductor area includes a second channel region overlapping the first portion of the detour portion.

The semiconductor area may include a first connector connecting the shielding area and the first channel region and including the second channel region, and the first connector crosses the first portion of the detour portion. The shielding area may be connected to the driving voltage line and is to receive a driving voltage. The first portion of the detour portion may include a portion between the shielding area and the driving gate electrode. The first portion of the detour portion may include a bent area that includes at least one bend. The shielding area may include a recessed area adjacent to the bent area. The detour portion may include a second portion connected to the first portion and extending in the first direction.

The second channel region may be between the bent area of the detour portion and the second portion. The second portion of the detour portion may be between the shielding area and the scan line. The second portion of the detour portion may cross the first data line. The semiconductor area may include a second connector connected to the shielding area, and the driving voltage line may be connected to the second connector through a contact hole of an insulating layer located between the second connector and the driving voltage line.

The driving gate electrode may be between the scan line and the main line portion of the control line. The driving voltage line may include an expansion area extending in the first direction, the expansion area overlapping the driving gate electrode to form a capacitor. The display device may include a second data line adjacent to the first data line, wherein the shielding area overlaps the first and second data lines.

The display device may include a third data line extending parallel to the first data line, wherein two of the driving gate electrode are between the first data line and the third data line, and wherein two of the expansion areas respectively overlapping the two driving gate electrodes are connected to each other. The detour portion may include a portion extending along a periphery of the shielding area and separated from the shielding area. The shielding area may include a recessed area that does not overlap the first data line, and the recessed area may be on an imaginary extending line of the main line portion extending in the first direction. The semiconductor area may include a longitudinal part at a side opposite to the second channel region relative to the driving gate electrode, and the longitudinal part includes a portion crossing the main line portion.

In accordance with one or more other embodiments, a pixel includes a first channel region; a driving gate electrode; a shielding area overlapping a data line; a second channel region overlapping the driving gate electrode; and a control line including a main line portion and a detour portion extending in different directions, the first channel region overlapping the detour portion. The detour portion may be between the shielding area and the driving gate electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
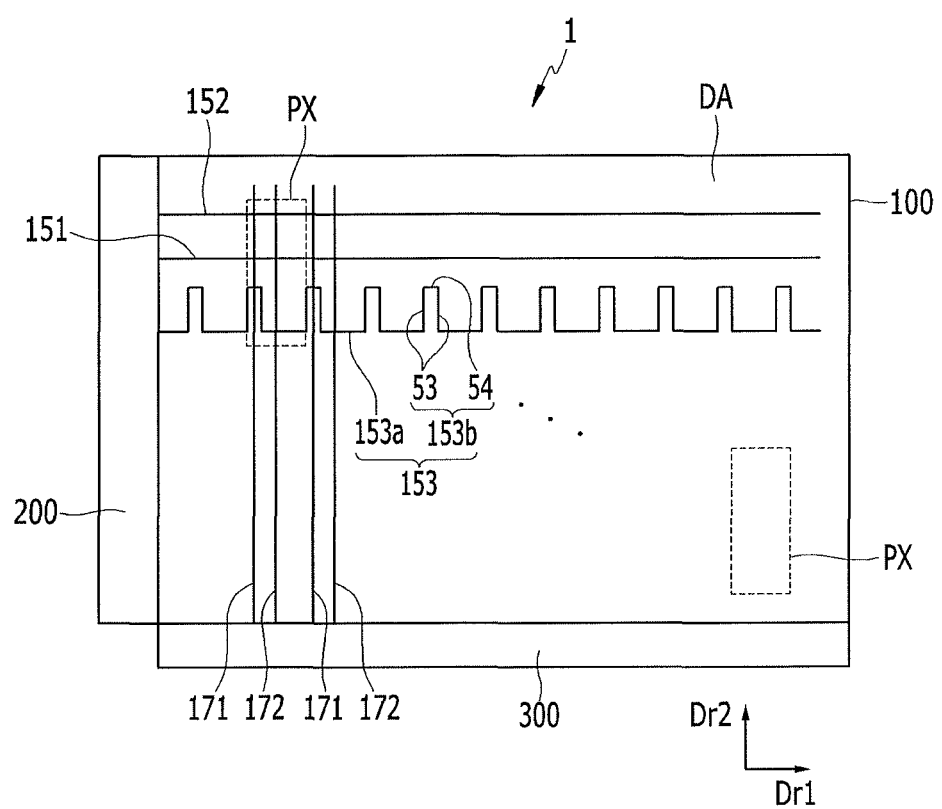
FIG. 1 illustrates an embodiment of a display device.

Example embodiments will now be described with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of a display device 1 which includes a display panel 100, a first driving unit 200, and a second driving unit 300. The display panel 100 includes a display area DA for displaying an image. The display area DA includes a plurality of pixels PX and a plurality of signal lines. In one embodiment, a pixel PX may be considered to be a minimum unit that emits light for displaying an image, e.g., a sub-pixel. In other embodiments, the pixel may include a plurality of sub-pixels.

Each pixel PX may include a plurality of transistors, a capacitor, and an organic light emitting diode connected to the plurality of signal lines. The signal lines may include scan lines 151 and 152, control lines 153, data lines 171, and driving voltage lines 172. The scan lines 151 and 152 transmit scan signals, which, for example, may have a gate-on voltage or a gate-off voltage to turn-on/turn-off at least one transistor in the pixel PX. The scan lines 151 and 152 connected to the pixel PX may include a present scan line 151 and a previous scan line 152 that transmit the gate-on voltage at different timing from the present scan line 151. The previous scan line 152 transmits the gate-on voltage at earlier timing than the present scan line.

The scan lines 151 and 152 extend substantially parallel to a first direction Dr1.

The control line 153 transmits at least one control signal, e.g., a light emitting control signal to control emission of light from the organic light emitting diode in the pixel PX. The control signal(s) transmitted by the control line 153 may be the gate-on voltage and/or the gate-off voltage having different waveforms from the scan signal transmitted by the scan lines 151 and 152.

The control line 153 does not extend in a predetermined direction, but is bent. For example, as shown in FIG. 1, the shape of the control line 153 may change direction in accordance with a regular or uniform pattern and with a predetermined pitch. The predetermined pitch may be, for example, the same as the width of at least one pixel PX in the first direction Dr1. When n pixels PX (n is a natural number of 1 or more) have a repeating pattern in the first direction Dr1, the width of at least one pixel PX may be the pitch of one repetition. In the example of FIG. 1, the control line 153 bends in a uniform pattern, where the width of one pixel PX in the first direction Dr1 corresponds to a repeating unit or cycle.

The control line 153 may include a plurality of separated main line portions 153a extending substantially parallel to the first direction Dr1 and a detour portion 153b between two adjacent main line portions 153a.

The detour portion 153b is connected to two facing end portions of the adjacent main line portions 153a. The detour portion 153b may include, for example, a pair of first portions 53 connected to the two facing end portions of the adjacent main line portions 153a, and a second portion 54 between the pair of first portions 53 connecting the first portions 53. The first portion 53 may extend substantially parallel to a second direction Dr2 crossing the first direction Dr1. The second portion 54 may extend substantially parallel to the first direction Dr1. In one embodiment, the second direction Dr2 may be perpendicular to or otherwise cross the first direction Dr1. The second portion 54 may be separated from the present scan line 151 and may extend substantially parallel to the present scan line 151. The first portion 53 may include the bent part that is bent at least one time.

One main line portion 153a and one detour portion 153b are connected to each other to form one unit and may be repeatedly arranged in the first direction Dr1. The distance between a center of the second portion 54 of one detour portion 153b and a center of the second portions 54 of the adjacent detour portions 153b may be, for example, the same as the width of at least one pixel PX in the first direction Dr1.

The data line 171 transmits the data signal and extends substantially parallel to the second direction Dr2, thereby crossing the scan lines 151 and 152.

The driving voltage line 172 transmits a driving voltage ELVDD and extends substantially parallel to the second direction Dr2, thus crossing scan lines 151 and 152.

Referring to FIG. 1, the main line portion 153a of the control line 153 does not include a portion overlapping the data line 171. The detour portion 153b of the control line 153 may include a portion crossing or overlapping the data line 171. For example, the control line 153 extends substantially parallel to the first direction Dr1 and then is bent at a position near the data line 171, thereby forming a detour portion 153b. The data line 171 may be between the pair of first portions 53 in one detour portion 153b of the control line 153. The second portion 54 of the detour portion 153b may cross and overlap the data line 171.

The first driving unit 200 and the second driving unit 300 may transmit each signal to the signal lines 151, 152, 153, 171, and 172. For example, the first driving unit 200 may include a scan driver transmitting the scan signal to the scan lines 151 and 152. The second driving unit 300 may include a data driver transmitting the data signal to the data line 171.

The first driving unit 200 may be directly formed on the display panel 100 along with the transistors in the pixel PX or may be attached to the display panel 100 as at least one driving circuit chip-type. In one embodiment, the first driving unit 200 may be attached on a printed circuit film, connected to the display panel 100, to transmit the signal to the display panel 100. The first driving unit 200 or the printed circuit film on the display panel 100 may be at a peripheral area on a periphery of the display area DA.

Figure 2:
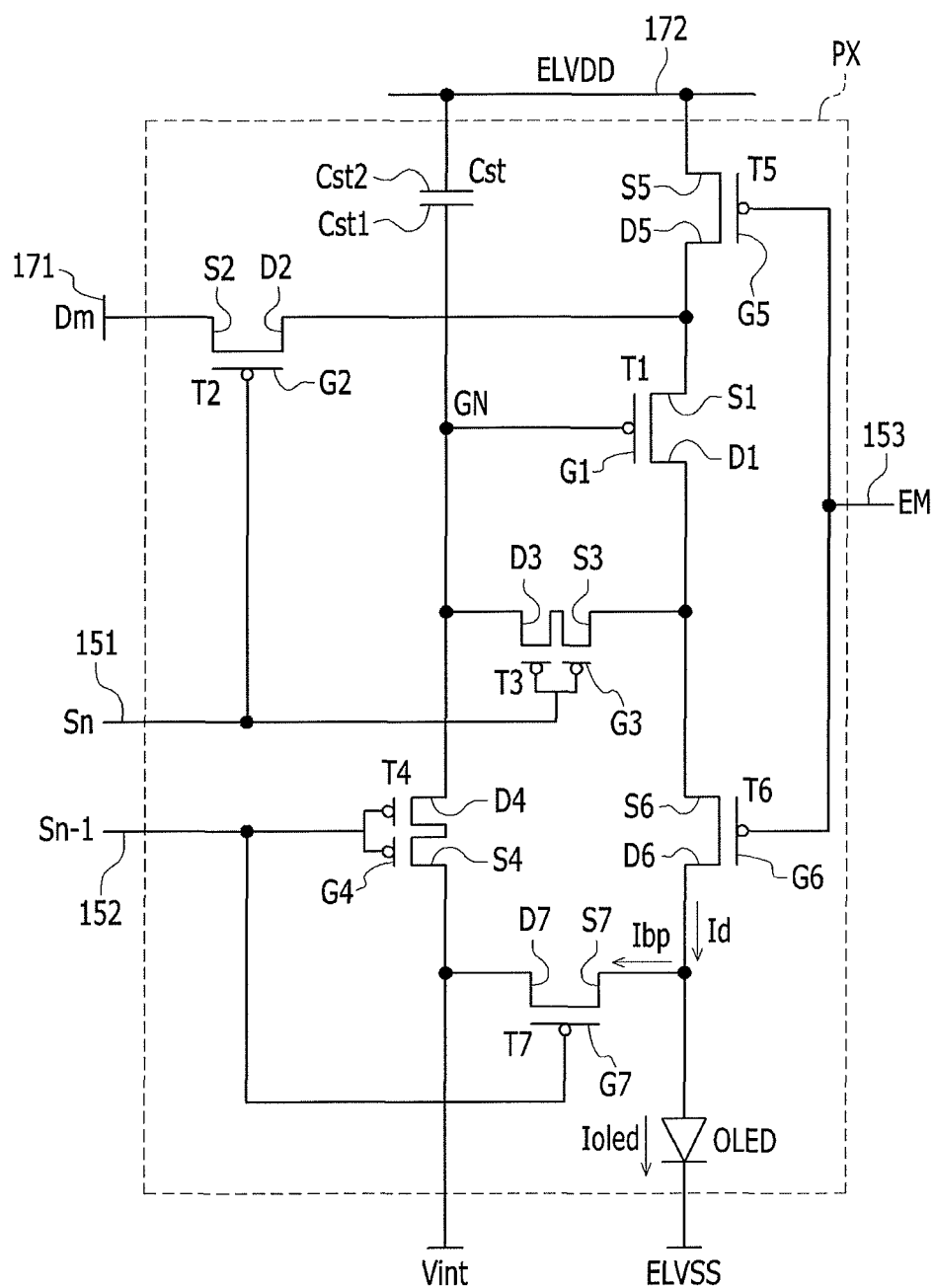
FIG. 2 illustrates an embodiment of a pixel.
Figure 3:
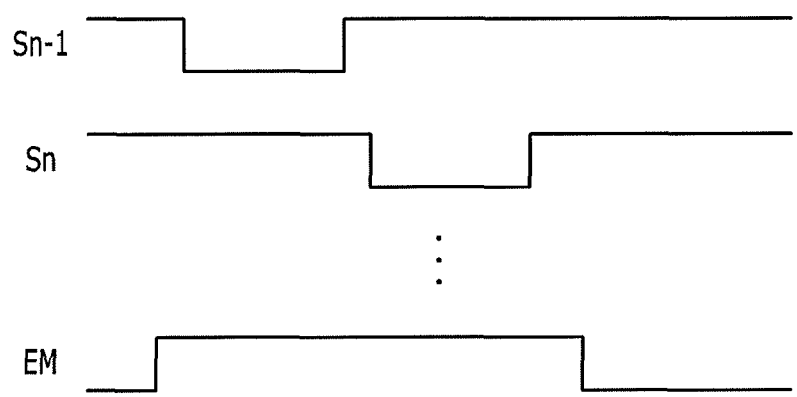
FIG. 3 illustrates an embodiment of timing diagram for the pixel.

FIG. 2 illustrates an embodiment of a pixel, which, for example, may be representative of the pixels PX in the display device 1 in FIG. 1. FIG. 3 illustrates an embodiment of a timing diagram for controlling the pixel in FIG. 2.

Referring to FIG. 2, the pixel PX is in an organic light emitting diode display. The pixel PX may include a plurality of transistors, a capacitor Cst, and an organic light emitting diode OLED connected to the signal lines 151, 152, 153, 171, and 172. The pixel PX may include one organic light emitting diode. The transistors may include a first transistor T1, a second transistor T2, third transistor T3, a fourth transistor T4, a fifth transistor T5, a sixth transistor T6, and a seventh transistor T7.

The present scan line 151 may transmit a scan signal Sn to the second transistor T2 and the third transistor T3. The previous scan line 152 may transmit a previous scan signal S(n−1) to the fourth transistor T4 and the seventh transistor T7. The control line 153 may transmit a light emitting control signal EM to the fifth transistor T5 and the sixth transistor T6.

The first transistor T1 has a gate electrode G1 connected to one terminal Cst1 of the capacitor Cst, a source electrode S1 connected to the driving voltage line 172 via the fifth transistor T5, and a drain electrode D1 electrically connected to an anode of the organic light emitting diode OLED, via the sixth transistor T6. The first transistor T1 receives a data signal Dm transmitted by the data line 171, depending on a switching operation of the second transistor T2, to supply a driving current Id to the organic light emitting diode OLED.

The second transistor T2 has a gate electrode G2 connected to the present scan line 151, a source electrode S2 connected to the data line 171, and a drain electrode D2 connected to the source electrode S1 of the first transistor T1 and to the driving voltage line 172, via the fifth transistor T5. The second transistor T2 is turned on depending on the scan signal Sn transmitted through the present scan line 151, so that the data signal Dm from the data line 171 may be transmitted to the source electrode S1 of the first transistor T1.

The third transistor T3 has a gate electrode G3 connected to the present scan line 151 and a source electrode S3 connected to the drain electrode D1 of the first transistor T1 and to the anode of the organic light emitting diode OLED, via the sixth transistor T6. The third transistor T3 has a drain electrode D3 connected to all of a drain electrode D4 of the fourth transistor T4, one terminal Cst1 of the capacitor Cst, and the gate electrode G1 of the first transistor T1. The third transistor T3 is turned on, depending on the scan signal Sn transmitted through the present scan line 151, to diode-connect the first transistor T1 by connecting the gate electrode G1 and the drain electrode D1 of the first transistor T1 to each other.

The fourth transistor T4 has a gate electrode G4 connected to the previous scan line 152, a source electrode S4 connected to a terminal of an initialization voltage Vint, and a drain electrode D4 connected to one terminal Cst1 of the capacitor Cst and the gate electrode G1 of the first transistor T1 through the drain electrode D3 of the third transistor T3.

The fourth transistor T4 is turned on, depending on the previous scan signal S(n−1) transmitted through the previous scan line 152, to transmit the initialization voltage Vint to the gate electrode G1 of first transistor T1. As a result, an initialization operation is performed to initialize the voltage of the gate electrode G1 of the first transistor T1.

The fifth transistor T5 has a gate electrode G5 connected to the control line 153, a source electrode S5 connected to the driving voltage line 172, and a drain electrode D5 connected to the source electrode S1 of the first transistor T1 and the drain electrode D2 of the second transistor T2.

The sixth transistor T6 has a gate electrode G6 connected to the control line 153, a source electrode S6 connected to the drain electrode D1 of the first transistor T1 and the source electrode S3 of the third transistor T3, and a drain electrode D6 electrically connected to the anode of the organic light emitting diode OLED. The fifth transistor T5 and the sixth transistor T6 are simultaneously turned on depending on the light emitting control signal EM transmitted thorough the control line 153. Thus, the driving voltage ELVDD is compensated by the diode-connected driving transistor T1 and then may be transmitted to the organic light emitting diode OLED.

The seventh transistor T7 has a gate electrode G7 connected to the previous scan line 152, a source electrode S7 connected to the drain electrode D6 of the sixth transistor T6 and the anode of the organic light emitting diode OLED, and a drain electrode D7 connected to the terminal of the initialization voltage Vint and the source electrode S4 of the fourth transistor T4. In one embodiment, the gate electrode G7 of the seventh transistor T7 may be connected to a separate control line.

The transistors T1, T2, T3, T4, T5, T6, and T7 may be P-type channel transistors. In another embodiment, at least one of the transistors T1, T2, T3, T4, T5, T6, and T7 may be an N-type channel transistor.

The capacitor Cst has a first terminal Cst1 connected to the gate electrode G1 of the first transistor T1 and a second terminal Cst2 connected to the driving voltage line 172. The organic light emitting diode OLED has a cathode connected to a terminal transmitting a common voltage ELVSS. The pixel PX may have a different structure with a different number of transistors and/or capacitors in another embodiment.

An embodiment of a method for driving the pixel is based on the waveform signals illustrated in FIG. 3, where transistors T1, T2, T3, T4, T5, T6, and T7 are P-type channel transistors.

Referring to FIG. 3, the method includes supplying the previous scan signal S(n−1) of a low level through the previous scan line 152 for an initialization period. Then, the fourth transistor T4 is turned on based on the previous scan signal S(n−1) of the low level, the initialization voltage Vint is connected to the gate electrode G1 of the first transistor T1 through the fourth transistor T4, and the driving transistor T1 is initialized by the initialization voltage Vint.

Subsequently, if the scan signal Sn of the low level is supplied through the present scan line 151 during a data programming and compensation period, the second transistor T2 and the third transistor T3 are turned on based on the scan signal Sn of the low level. In this case, the first transistor T1 is diode-connected by the turned-on third transistor T3 and is biased in a forward direction. Accordingly, a compensation voltage (Dm+Vth, Vth is a negative value) decreased by a threshold voltage Vth of the first transistor T1 from the data signal Dm from the data line 171 is applied to the gate electrode G1 of the first transistor T1.

Thus, the gate voltage applied to the gate electrode G1 of the first transistor T1 becomes the compensation voltage (Dm+Vth).

The driving voltage ELVDD and the compensation voltage (Dm+Vth) are respectively applied to the terminals of the capacitor Cst. The capacitor Cst is charged based on a voltage difference between the terminals.

Next, the light emitting control signal EM from the control line 153 changes from the high level to the low level during a light emitting period. As a result, during the light emitting period, the fifth transistor T5 and the sixth transistor T6 are turned on by the light emitting control signal EM of the low level. Thus, a driving current Id is generated based on a voltage difference between the gate voltage of the gate electrode G1 of the first transistor T1 and the driving voltage ELVDD, and the driving current Id is supplied to the organic light emitting diode OLED through the sixth transistor T6. As a result, a current Ioled flows to the organic light emitting diode OLED.

During the light emission period, the gate-source voltage Vgs of the first transistor T1 is maintained as "(Dm+Vth)−ELVDD" by the capacitor Cst. According to a current-voltage relationship of the first transistor T1, the driving current Id may be proportional to a square '(Dm−ELVDD)$^2$' of a value obtained by subtracting the threshold voltage from the driving gate-source voltage. Accordingly, the driving current Id may be determined regardless of the threshold voltage Vth of the first transistor T1.

During an initialization period, the seventh transistor T7 receives the previous scan signal S(n−1) of the low level through the previous scan line 152 to be turned on. Part of the driving current Id flows out through the seventh transistor T7 as a bypass current Ibp.

Figure 4:
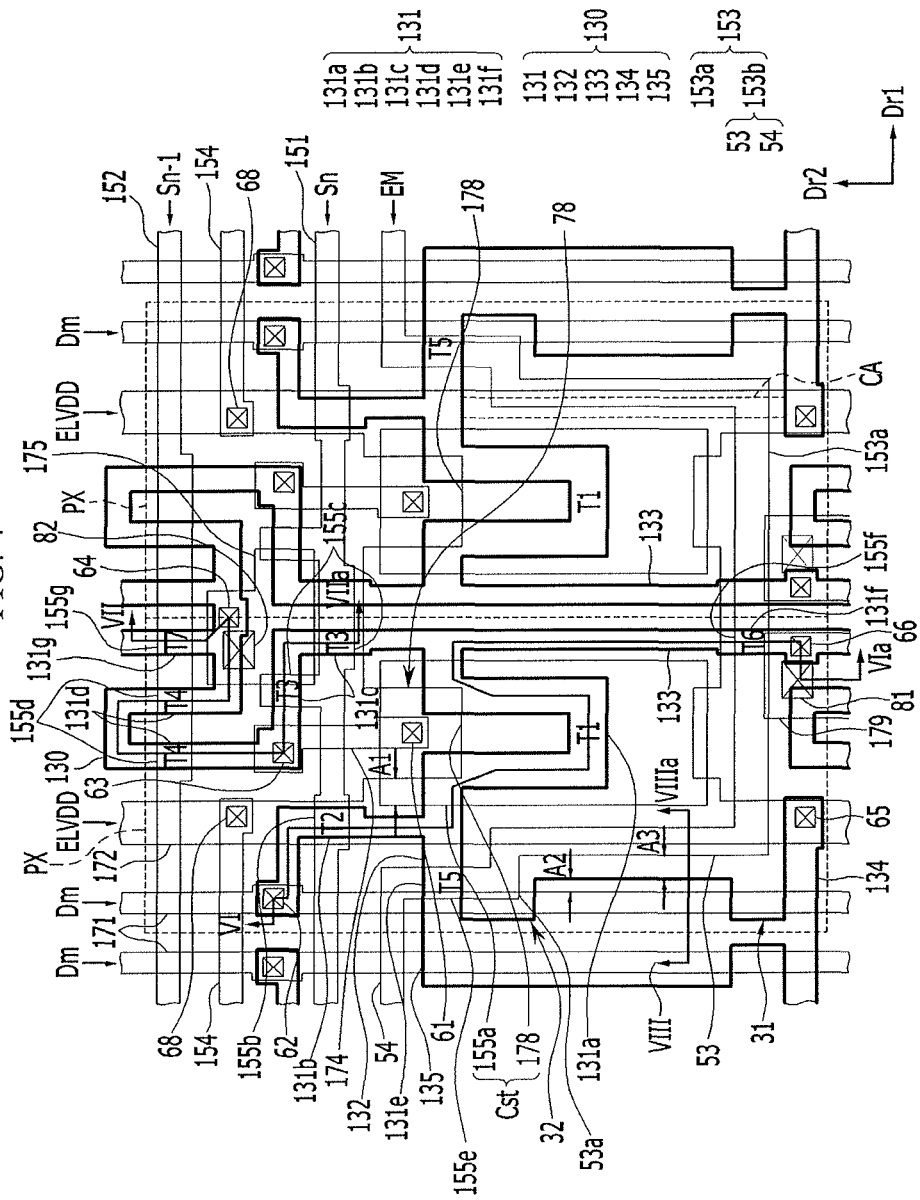
FIG. 4 illustrates a layout embodiment of adjacent pixels.
Figure 5:
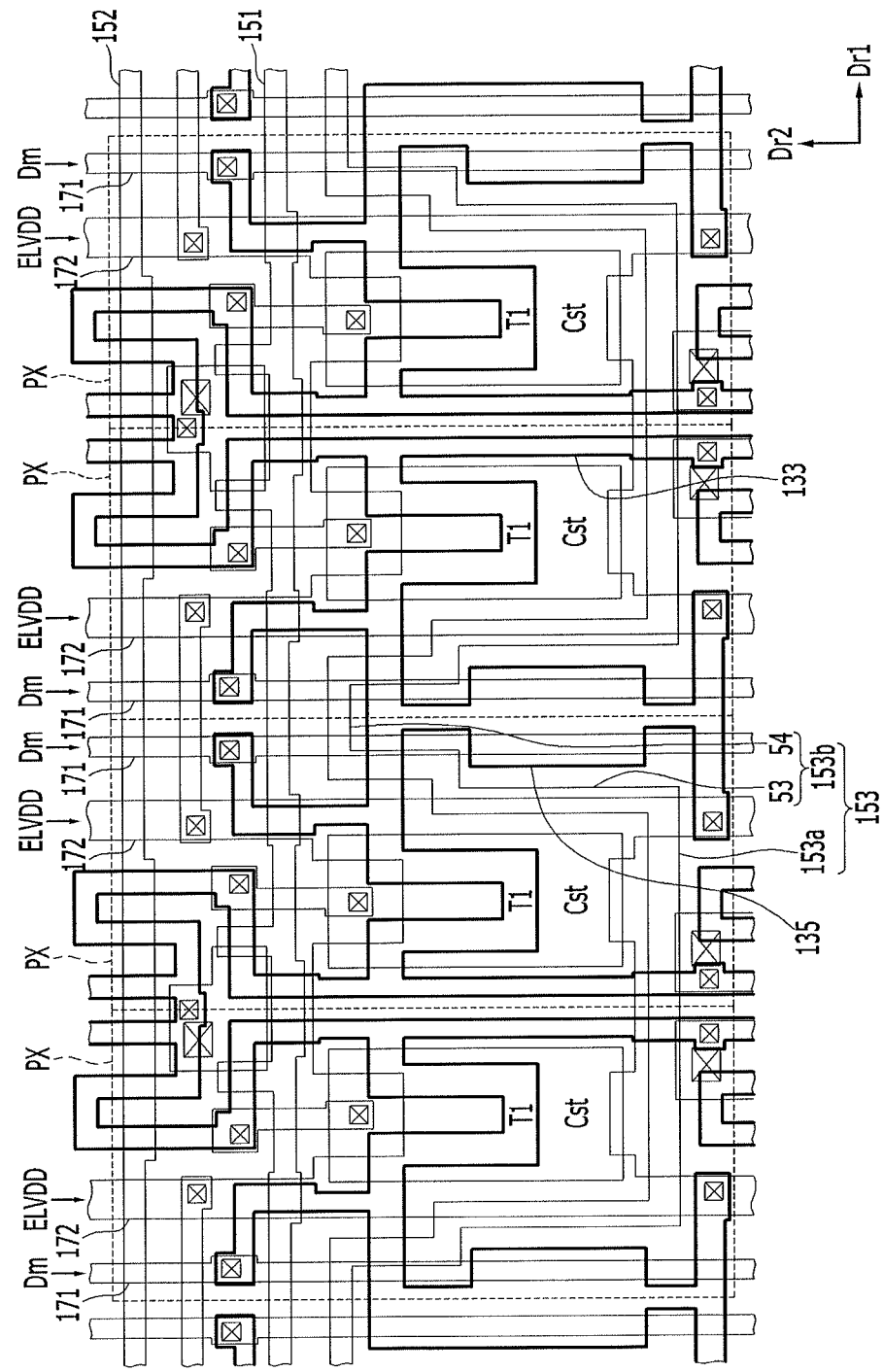
FIG. 5 illustrates another layout embodiment of adjacent pixels.
Figure 6:
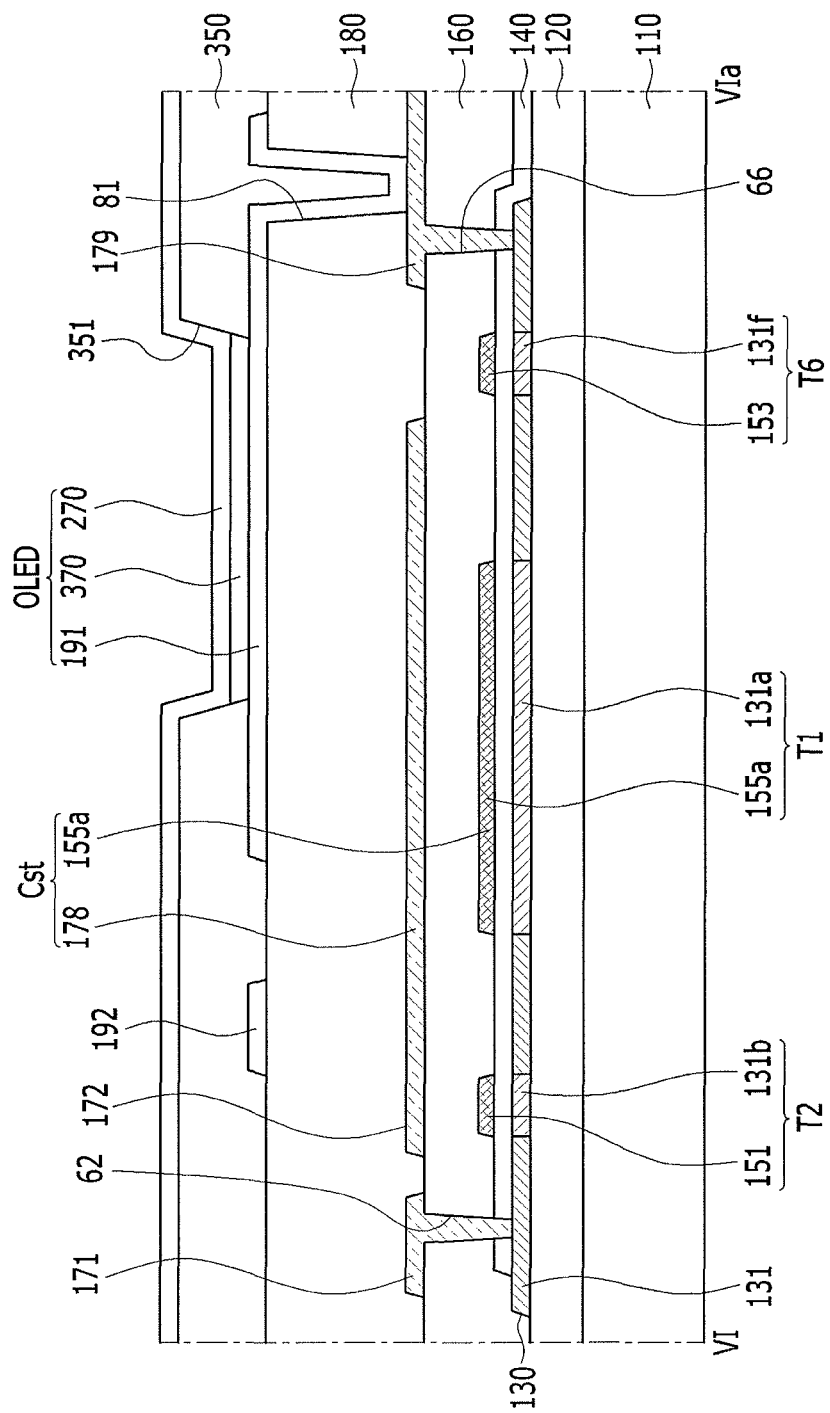
FIG. 6 illustrates a view taken along section line VI-VIa in FIG. 4.
Figure 7:
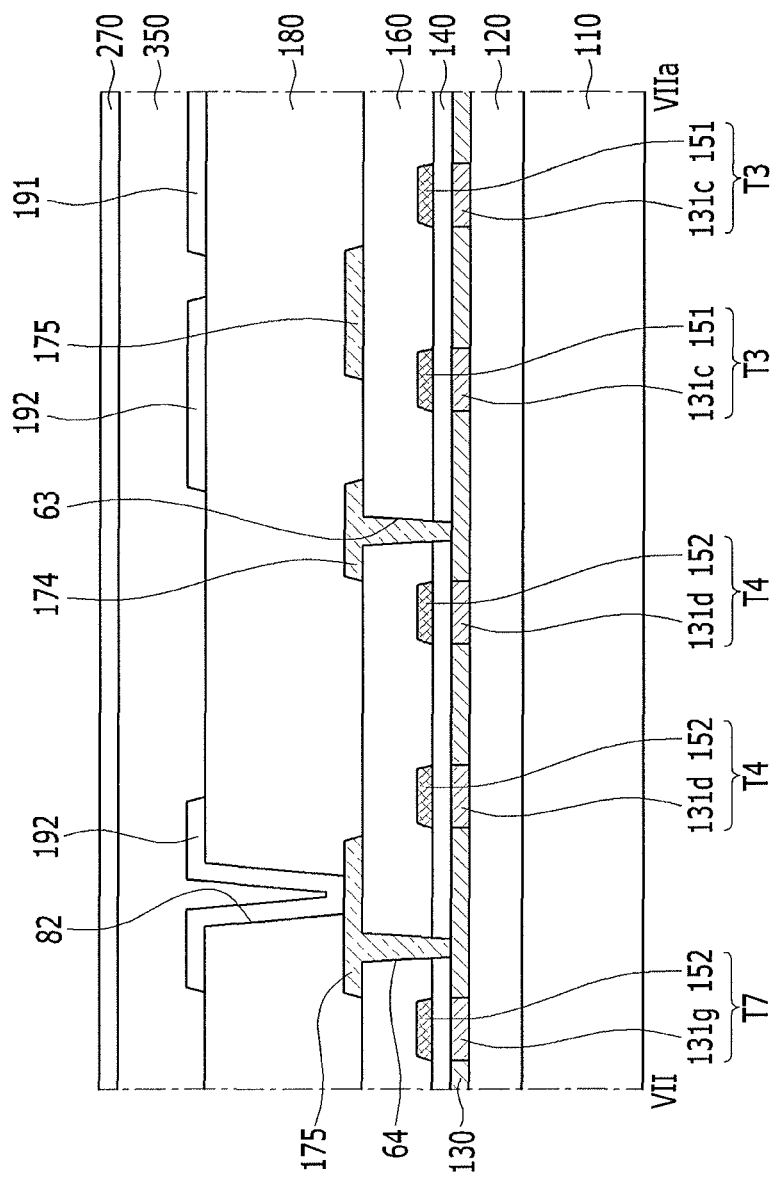
FIG. 7 illustrates a view taken along section line VII-VIIa in FIG. 4.
Figure 8:
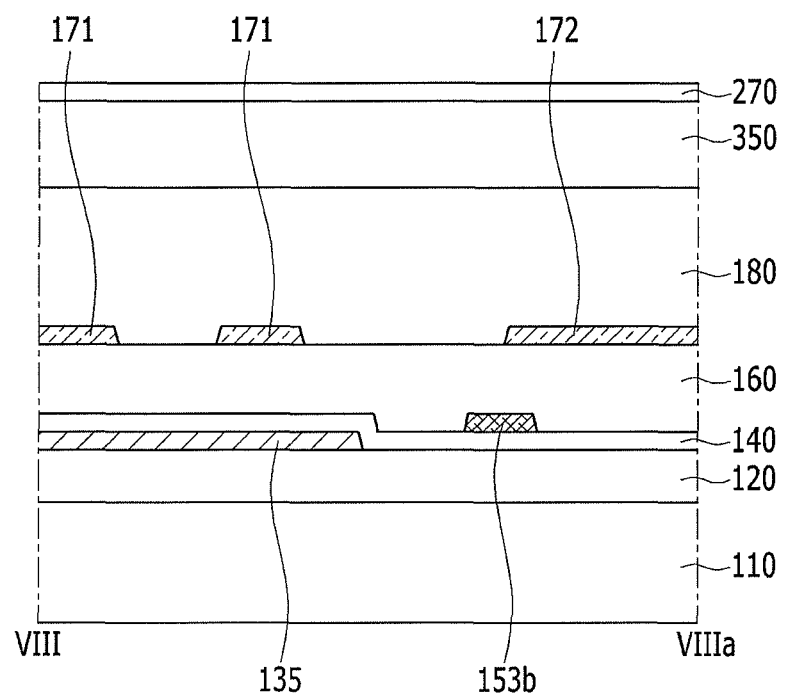
FIG. 8 illustrates a view taken along section line VIII-VIIIa in FIG. 4.

FIG. 4 illustrates a layout embodiment of two adjacent pixels of a display device. FIG. 5 illustrates a layout embodiment of four adjacent pixels of a display device. FIG. 6 is a view taken along section line VI-VIa in FIG. 4. FIG. 7 is a view taken along section line VII-VIIa in FIG. 4. FIG. 8 is a view taken along section line VIII-VIIIa in FIG. 4.

Referring to FIGS. 1, 3, 4, and 5, a pixel PX of the display may include the plurality of transistors T1, T2, T3, T4, T5, T6, and T7 and the capacitor Cst connected to the present scan line 151, the previous scan line 152, the control line 153, the data line 171, and the driving voltage line 172.

Two pixels PX adjacent in the first direction Dr1 may have structure which is, for example, axisymmetric with respect to a boundary between them. The data line 171 and the driving voltage line 172 may have an axisymmetric structure with respect to the boundary between two adjacent pixels PX. Accordingly, two directly adjacent data lines 171 may form a pair.

The data line 171 and the driving voltage line 172 may extend substantially parallel to the second direction Dr2. The data line 171 may be overlaid and overlap a shielding part 135 applied with a predetermined voltage, in a plan view. The data line 171 may completely overlap the shielding part 135 in the first direction Dr1. For example, the width of the shielding part 135 in the first direction Dr1 may be greater than the width of the data line 171 in the first direction Dr1. When the shielding part 135 overlaps the two adjacent data lines 171, the width of the shielding part 135 in the first direction Dr1 may be greater than a sum of the widths of the two adjacent data lines 171 and a space therebetween in the first direction Dr1.

The driving voltage line 172 may include an expansion part 178 expanding in the first direction Dr1. The expansion part 178 extends in a side opposite to the data line 171 directly adjacent to the driving voltage line 172, and one expansion part 178 may be positioned in each pixel PX. Two expansion parts 178 in two adjacent pixels PX, without the data line 171 therebetween in the first direction Dr1, may be connected to each other. Accordingly, the driving voltage ELVDD transmitted by the driving voltage line 172 may also be uniformly transmitted in the first direction Dr1, through the expansion parts 178 connected to each other for the two adjacent pixels PX.

The expansion part 178 may include a recessed part 78 at an upper side of the expansion part 178.

The adjacent driving voltage lines 172 may be connected through a connecting member 154. The connecting member 154 may extend substantially in the first direction Dr1. The driving voltage line 172 is connected to the connecting member 154 through a contact hole 68. Accordingly, the driving voltage ELVDD is transmitted along the driving voltage line 172 in the second direction Dr2 and is also transmitted through the connecting member 154 in the first direction Dr1, thereby being transmitted in a mesh structure in the entire display panel 100. Accordingly, the driving voltage ELVDD reduces deviation in the whole display panel 100 and reduces or minimizes voltage drop in a partial region such that the driving voltage ELVDD may be uniformly transmitted.

Referring to FIG. 4, the previous scan line 152 may be on the present scan line 151 and the control line 153 may be under the present scan line 151. The control line 153, as described above, includes a plurality of main line portions 153a extending parallel to the first direction Dr1 and a detour portion 153b connected to the main line portion 153a. The main line portion 153a may be between the two adjacent data lines 171 and may not overlap the data line 171. The main line portion 153a is bent near the data line 171 connected to the detour portion 153b. The detour portion 153b may include the first portion 53 extending substantially parallel to the second direction Dr2 and a second portion 54 extending mainly parallel to the first direction Dr1.

The first portion 53 may start from the main line portion 153a, extend toward the present scan line 151, and be connected to the second portion 54 at the end. The first portion 53 may be bend at least one time. For example, as shown in FIG. 4, the first portion 53 may extend from the main line portion 153a toward the present scan line 151, may be bent and extend toward the data line 171, and may again be bent and extend toward the present scan line 151. A portion of which the first portion 53 is bent at least one time is referred to as a bent part 53a.

The second portion 54 may overlapped the data line 171 while being crossed.

Referring to FIG. 4 and FIG. 5, according to the symmetrical structure of the two adjacent pixels PX, the distance between the center of the second portion 54 of one detour portion 153b and the center of the second portion 54 of the adjacent detour portion 153b may be about equal to or greater than the width of two pixels PX in the first direction Dr1. The width of two pixels PX in the first direction Dr1 may correspond to a pitch of the first direction Dr1 of a unit, formed by the two adjacent pixels PX repeated in the first direction Dr1. Thus, the width of two pixels PX in the first direction Dr1, as shown in FIGS. 4 and 5, may be equal to the distance between the longitudinal center line between a pair of data lines 171 that are directly adjacent and the longitudinal center line between a pair of data lines 171 that are next adjacent.

The second portion 54 may overlap the boundary of two pixels PX adjacent via the two adjacent data lines 171 therebetween.

Each channel of the transistors T1, T2, T3, T4, T5, T6, and T7 of one pixel PX may be formed in one semiconductor member 130, and the semiconductor member 130 may be bent in various shapes. The semiconductor member 130 may include a semiconductor material such as a polysilicon or an oxide semiconductor.

The semiconductor member 130 includes a channel region 131 forming each channel of the transistors T1, T2, T3, T4, T5, T6, and T7 and a conductive region. Each channel region 131 of the transistors T1, T2, T3, T4, T5, T6, and T7 is indicated by 131a, 131b, 131c, 131d, 131e, 131f, and 131g. The conductive region of the semiconductor member 130 is at different sides of each of the channel regions 131a, 131b, 131c, 131d, 131e, 131f, and 131g and has a greater carrier concentration than the carrier concentration of the channel regions 131a, 131b, 131c, 131d, 131e, 131f, and 131g. In the semiconductor member 130, most of the remaining portion, except for the channel regions 131a, 131b, 131c, 131d, 131e, 131f, and 131g, may be the conductive region. The conductive region at different sides of the channel regions 131a, 131b, 131c, 131d, 131e, 131f, and 131g of each transistor T1, T2, T3, T4, T5, T6, and T7 may become a source region and a drain region of the corresponding transistors T1, T2, T3, T4, T5, T6, and T7, and thus may function as a source electrode and a drain electrode.

Referring to FIGS. 4 and 5, the semiconductor member 130 in one pixel PX may include a longitudinal part 133 connected to one terminal of the channel region 131a of the first transistor T1, a connection part 132 connected to the other terminal of the channel region 131a, and the shielding part 135 connected to the connection part 132.

The longitudinal part 133 may be at a side opposite to the data line 171 with respect to the channel region 131a. The longitudinal part 133 may be substantially the conductive region and may extend substantially parallel to the second direction Dr2.

The connection part 132 may be at the side opposite to the longitudinal part 133 with respect to the channel region 131a and, for example, may extend substantially in the first direction Dr1.

The shielding part 135 is connected to the connection part 132 and may overlap the data line 171, thereby shielding the data line 171. The shielding part 135 may be in the conductive region of the semiconductor member 130. As described above, the shielding part 135 may completely overlap the data line 171 in the first direction Dr1. For example, the width of the shielding part 135 in the first direction Dr1 may be greater than the width of the data line 171 in the first direction Dr1.

The shielding part 135 is connected to a connection part 134 connected to the driving voltage line 172 through a contact hole 65, thereby receiving the driving voltage ELVDD. The connection part 134 as a part of the semiconductor member 130 may extend substantially in the direction parallel to the first direction Dr1.

The shielding part 135 shields the data line 171 to prevent a the voltage of the other adjacent conductors from changing when the data signal transmitted by the data line 171 changes.

In the exemplary embodiment in FIGS. 4 and 5, according to the symmetrical structure of the two adjacent pixels PX, one shielding part 135 may overlap two adjacent data lines 171. In this case, one shielding part 135 completely overlaps the two adjacent data lines 171 in the first direction Dr1. For example, the width of one shielding part 135 in the first direction Dr1 may be greater than the sum of the widths of the two adjacent data lines 171 and the space therebetween in the first direction Dr1.

The shielding part 135 may include a recessed part 32 at the portion adjacent to the bent part 53a of the control line 153. The space where the control line 153 bends and extends may be obtained by the recessed part 32. The width of the shielding part 135 in the first direction Dr1 adjacent to the recessed part 32 in the first direction Dr1 may be less than the width of the other portion of the shielding part 135 in the first direction Dr1. In the recessed part 32, the shielding part 135 may not overlap the entire width direction of one data line 171 of the two adjacent data lines 171.

In one embodiment, the shielding part 135 may include at least one recessed part 31. FIG. 4 illustrates an example in which a pair of recessed parts 31 face to each other. In the recessed part 31, the shielding part 135 may not overlap the data line 171. The recessed part 31 may be on an imaginary extending line of the main line portion 153a of the control line 153. The size of the recessed part 31 may be appropriately controlled by considering the shielding effect of the data line 171 (by the overlapping of the shielding part 135 and the data line 171) and a delay degree of the data signal Dm.

According to an exemplary embodiment, the semiconductor member 130 is not under the connection part 132 of the semiconductor member 130 and between the channel region 131a and the shielding part 135. For example, the semiconductor member 130 is not in a region CA at the side opposite to the longitudinal part 133 with respect to the channel region 131a and facing the longitudinal part 133 and in the right and left periphery thereof. Accordingly, the margin of space may increase where the first portion 53 in the detour portion 153b of the control line 153 is disposed. Also, an interval A3 between the first portion 53 of the control line 153 and the shielding part 135 may be sufficiently widened. Accordingly, process margin increases such that an overlapping risk between the first portion 53 of the control line 153 and the shielding part 135 is reduced, thereby reducing a yield reduction.

The interval A3 between the first portion 53 of the control line 153 and the shielding part 135 may be a predetermined size, e.g., about 1 um or more. As the resolution of the display device increases, the size of the pixel PX may reduce. As a result, the risk of a defect occurring due to alignment error in the process increases. However, according to the present exemplary embodiment, the interval A3 between the first portion 53 of the control line 153 and the shielding part 135 may be sufficiently obtained such that the defect due to the alignment error in the process may be reduced for a display device of high resolution.

The first transistor T1 includes the channel region 131a, the source region, and the drain region as the conductive regions of the semiconductor member 130 at respective sides of the channel region 131a, and a driving gate electrode 155a overlapping the channel region 131a.

The channel region 131a may be bent at least one time. In one embodiment, the channel region 131a of the first transistor T1 may have a meandering or zigzag shape. FIGS. 4 and 5 illustrate an example in which the channel region 131a has an approximate "U" shape. The longitudinal part 133 connected to the channel region 131a may correspond to the drain region of the first transistor T1. The part of the connection part 132 connected to the channel region 131a may correspond to the source region of the first transistor T1.

The driving gate electrode 155a may be between the longitudinal part 133 of the semiconductor member 130 and the first portion 53 of the control line 153, in a plan view. The driving gate electrode 155a may be connected to a connecting member 174 through a contact hole 61. The connecting member 174 may include an end portion in the recessed part 78 of the expansion part 178. The contact hole 61 may be in the recessed part 78 of the expansion part 178.

The driving gate electrode 155a and the channel region 131a of the first transistor T1 may be between the control line 153 of the present scan line 151 and main line portion 153a, in a plan view. Also, based on the symmetrical structure of the two adjacent pixels PX, a pair of driving gate electrodes 155a and a pair of channel regions 131a may be between two adjacent detour portions 153b in the first direction Dr1.

The second transistor T2 includes a channel region 131b, the source region, and the drain region as conductive regions of the semiconductor member 130 at respective sides of the channel region 131b, and a gate electrode 155b overlapping the channel region 131b. The portion overlapping the semiconductor member 130 for the present scan line 151 may form gate electrode 155b. The conductive region of the semiconductor member 130, positioned upwardly with respect to the present scan line 151 and connected to the channel region 131b as the source region of the second transistor T2, is connected to the data line 171 through a contact hole 62. The channel region 131b is connected to the connection part 132 of the semiconductor member 130. The part of the semiconductor member 130 and the connection part 132 between the channel region 131b and connection part 132 corresponds to the drain region of the second transistor T2.

The third transistor T3 includes the channel region 131c, the source region, and the drain region as conductive regions of the semiconductor member 130 at respective sides of the channel region 131c, and a gate electrode 155c overlapping the channel region 131c. The portion overlapping the semiconductor member 130 for the present scan line 151 may form gate electrode 155c. The gate electrode 155c may be formed of two portions to prevent leakage current. The conductive region of the semiconductor member 130, positioned upwardly with respect to the present scan line 151 and connected to the channel region 131c as the drain region of the third transistor T3, is connected to the connecting member 174 through a contact hole 63. The channel region 131c is connected to the longitudinal part 133 of the semiconductor member 130, and the longitudinal part 133 corresponds to the source region of the third transistor T3.

The fourth transistor T4 includes the channel region 131d, the source region, and the drain region as conductive regions of the semiconductor member 130 at respective sides of the channel region 131d, and a gate electrode 155d overlapping the channel region 131d. The portion overlapping the semiconductor member 130 for the previous scan line 152 may form the gate electrode 155d. The gate electrode 155d may be formed of two portions to prevent leakage current. The conductive region of the semiconductor member 130, that is positioned downwardly with respect to the previous scan line 152 and is not connected to the third transistor T3 as the source region of the fourth transistor T4, is connected to a connecting member 175 through a contact hole 64.

The fifth transistor T5 includes the channel region 131e, the source region, and the drain region as the conductive regions of semiconductor member 130 at respective sides of the channel region 131e, and a gate electrode 155e overlapping the channel region 131e. The channel region 131e may be a part of the connection part 132. The portion overlapping the connection part 132 of the semiconductor member 130 for the control line 153 may form the gate electrode 155e. For example, the portion overlapping the connection part 132 of the semiconductor member 130 for the first portion 53 of the detour portion 153b of the control line 153 may form the gate electrode 155e.

FIG. 4 illustrates an example in which the portion that the upper portion of the bent part 53a for the first portion 53 of the control line 153 overlaps the connection part 132 of the semiconductor member 130 becomes the gate electrode 155e. The conductive region of the semiconductor member 130 between the channel region 131e and the channel region 131a or the channel region 131b corresponds to the drain region of the fifth transistor T5. The conductive region of the semiconductor member 130 between the channel region 131e and the shielding part 135 and the shielding part 135 connected thereto may correspond to the source region of the fifth transistor T5.

The sixth transistor T6 includes the channel region 131f, the source region, and the drain region as the conductive regions of semiconductor member 130 at respective sides of the channel region 131f, and a gate electrode 155f overlapping the channel region 131f. The portion overlapping the semiconductor member 130 for the control line 153 may form the gate electrode 155f. For example, the portion overlapping the semiconductor member 130 for the main line portion 153a of the control line 153 may form the gate electrode 155f. The conductive region of the semiconductor member 130, positioned downwardly with respect to the control line 153 as the drain region of the sixth transistor T6, is connected to a connecting member 179 through a contact hole 66. The channel region 131f is also connected to longitudinal part 133 of the semiconductor member 130, and the longitudinal part 133 corresponds to the source region of the sixth transistor T6.

The seventh transistor T7 includes the channel region 131g, the source region, and the drain region as the conductive regions of the semiconductor member 130 at respective sides of the channel region 131g, and a gate electrode 155g overlapping the channel region 131g. The portion overlapping the semiconductor member 130 for the previous scan line 152 may form the gate electrode 155g. The conductive region of the semiconductor member 130, positioned downwardly with respect to the previous scan line 152 as the drain region of the seventh transistor T7, is connected to the source region of the fourth transistor T4 and is connected to the connecting member 175 through the contact hole 64. The conductive region of the semiconductor member 130, positioned upwardly with respect to the previous scan line 152 as the source region of the seventh transistor T7, is connected to the drain region of the sixth transistor T6 and is connected to the connecting member 179 through the contact hole 66.

One terminal of the channel region 131a of the first transistor T1 may be connected to the second transistor T2 and the fifth transistor T5. The other terminal of the channel region 131a may be connected to the third transistor T3 and the sixth transistor T6.

The capacitor Cst may include the driving gate electrode 155a and the expansion part 178 of the driving voltage line 172 as two terminals. The capacitor Cst may maintain the voltage difference corresponding to the difference between the driving voltage ELVDD transmitted through the driving voltage line 172 and the voltage of the driving gate electrode 155a. Like the present exemplary embodiment, if the capacitor Cst is formed by directly overlapping the driving gate electrode 155a of the first transistor T1 and the portion of the driving voltage line 172 via the insulating layer therebetween, it is not necessary to form a separate electrode to form the capacitor Cst. As a result, manufacturing costs may be reduced and the capacitor Cst of the wide area may be formed, thereby increasing space utilization efficiency and forming the capacitor Cst of sufficient capacitance.

According to the present exemplary embodiment, since the semiconductor member 130 is not between the channel region 131a and the shielding part 135, a space is provided to allow the driving gate electrode 155a to be widened in the first direction Dr1. As a result, the relative area of the driving gate electrode 155a may be sufficiently obtained. Accordingly, the capacitance of the capacitor Cst may be sufficiently ensured. Also, a space margin for forming the first transistor T1 may be obtained.

In addition, the width of the driving gate electrode 155a may further extend in the first direction Dr1. As a result, the width of the overlapping region of the driving gate electrode 155a and the expansion part 178 may increase. For example, the width A1 of the first direction Dr1 of the portion where the driving gate electrode 155a overlaps the portion positioned at the right and left of the recessed part 78, among the expansion part 178 of the driving voltage line 172, may increase. As a result, a deviation may be prevented from occurring in the overlapping area of the driving gate electrode 155a and the expansion part 178 of the driving voltage line 172 by alignment error on the process. Accordingly, process margin may be sufficiently improved and display defects caused by deviation of the capacitor Cst may be reduced.

The driving gate electrode 155a is connected to one terminal of the connecting member 174 through the contact hole 61. The other terminal of the connecting member 174 is connected to the drain region of the third transistor T3 and the drain region of the fourth transistor T4 through the contact hole 63. The connecting member 174 may extend substantially parallel to the second direction Dr2. The connecting member 174 may correspond to the driving gate node GN in FIG. 2, along with the driving gate electrode 155a.

The connecting member 179 may be connected to a pixel electrode through a contact hole 81. The connecting member 175 may be connected to an initialization voltage line transmitting the initialization voltage Vint through a contact hole 82.

In the present exemplary embodiment, shielding part 135 having conductivity overlaps the data line 171 to shield the data line 171. As a result, parasitic capacitance between the data line 171 and the adjacent driving gate electrode 155a or the conductor connected thereto may be blocked. For example, the shielding part 135 blocks the parasitic capacitance between the data line 171 and the driving gate electrode 155a. As a result, a changed in the voltage of the driving gate electrode 155a may be prevented depending on the signal change of the data signal Dm. As a result, the driving current Id of the organic light emitting diode OLED is not changed. Thus, a quality defect (e.g., crosstalk caused by a luminance change by the parasitic capacitance between the data line 171 and the driving gate electrode 155a) may be reduced or prevented.

The shielding part 135 is a part of semiconductor member 130. Accordingly, it is not necessary to additionally form a separate electrode for the shielding of the data line 171. As a result, data line 171 may be easily shielded without increasing manufacturing costs of the display device.

Also, control line 153, and particularly the detour portion 153b of the control line 153, passes between the data line 171 and the driving gate electrode 155a, in a plan view, to shield between the data line 171 and the driving gate electrode 155a. As a result, generation of the parasitic capacitance between the data line 171 and the driving gate electrode 155a may be blocked.

According to the present exemplary embodiment, the shielding part 135 and the connection part 134 of the semiconductor member 130 may not overlap the signal line substantially transmitting the signal in the first direction Dr1 in the display panel 100. For example, the shielding part 135 of the semiconductor member 130 may not overlap the scan lines 151 and 152 and the control lines 153. In one embodiment, the imaginary extending line of the main line portion 153a of the control line 153 passes the shielding part 135. However, the shielding part 135 does not actually overlap the control line 153.

As above-described, the main line portion 153a of the control line 153 extends in the first direction Dr1, and then bends in the second direction Dr2 near shielding part 135 to form the detour portion 153b. The detour portion 153b extends substantially in the second direction Dr2 between the shielding part 135 and the driving gate electrode 155a, so that the control line 153 does not overlap the shielding part 135.

The first portion 53 of the detour portion 153b may extend along the edge of the shielding part 135 and may be separated from shielding part 135. An interval between the shielding part 135 and the first portion 53 or the second portion 54 of the control line 153, in a plan view, may be greater than a predetermined value, e.g., 0.

If the control line 153 does not include the detour portion 153b and constantly extends in the first direction Dr1 (like the scan lines 151 and 152), the control line 153 will overlap the shielding part 135 of the semiconductor member 130. In this case, an additional parasitic transistor may be generated. If the additional parasitic transistor is formed, the shielding part 135 is substantially floated. As a result, the voltage of the shielding part 135 does not maintain a constant voltage level such as the driving voltage ELVDD, but is changed. Thus, the data signal Dm transmitted by the data line 171 is affected by the shielding part 135. For example, color deviation or a stain may be generated in the image displayed by the display panel 100.

However, according to the present exemplary embodiment, the control line 153 is detoured so as not to overlap the shielding part 135 of the semiconductor member 130. As a result, the detour portion 153b is formed which extends along and around the periphery of the shielding part 135 and which is separated from (does not overlap) the shielding part 135. Accordingly, unnecessary overlapping of the shielding part 135 and the control line 153 does not occur and a parasitic transistor is not formed. Accordingly, an unnecessary change in the data signal Dm transmitted on data line 171 is prevented from occurring. As a result, color deviation and stains may be prevented in the image displayed by the display device.

According to an exemplary embodiment, the semiconductor member 130 is not under the connection part 132 of the semiconductor member 130 and between the channel region 131a and the shielding part 135. For example, the semiconductor member 130 is not in the region CA at the side opposite to the longitudinal part 133 with respect to the channel region 131a and facing the longitudinal part 133 and in the right and left periphery thereof. Accordingly, the overlapping margin of the shielding part 135 and the data line 171 may further increase. For example, the width A2 in the first direction Dr1 of the remaining region, outside the region overlapping the data line 171 among the shielding part 135, may be increased. The width A2 may have a sufficient width, e.g., about 1.0 um or more.

Accordingly, even if there is a general level of process error, the risk of formation of a data line 171 not covered by shielding part 135 is reduced. For example, as the resolution of the display device is increases, the size of the pixel PX decreases. The risk of a defect occurring due to process error therefore increases. However according to the present exemplary embodiment, the risk of data line 171 not being covered by the shielding part 135 decreases. As a result, any effect caused by a change in the data signal on the data line 171 may be reduced for a high resolution display.

Referring to FIGS. 4, 5, 6, and 8, a display panel of a display device according to another exemplary embodiment may include a substrate 110. The substrate 110 may be an insulating substrate including, for example, glass, quartz, ceramic, or plastic.

A buffer layer 120 may be on the substrate 110 to block impurities from the substrate 110 to an upper layer for the buffer layer 120, and particularly the semiconductor member 130. The buffer layer 120 may therefore allow characteristics of the semiconductor member 130 to improve, and also stress applied to the semiconductor member 130 may be reduced. The buffer layer 120 may include, for example, an inorganic insulating material such as a silicon nitride (SiNx) or a silicon oxide (SiOx), or an organic insulating material. In one embodiment, at least part of the buffer layer 120 may be omitted.

The above-described semiconductor member 130 is on the buffer layer 120 and a gate insulating layer 140 is on the semiconductor member 130.

A gate conductor including the present scan line 151 including the above-described gate electrodes 155*b* and 155*c*, the previous scan line 152 including the gate electrodes 155*d* and 155*g*, the control line 153 including the gate electrodes 155*e* and 155*f*, the driving gate electrode 155*a*, and the connecting member 154 may be on the gate insulating layer 140. The gate conductor may include a metal such as copper (Cu), aluminum (Al), molybdenum (Mo), or alloys thereof.

An interlayer insulating layer 160 is on the gate conductor and gate insulating layer 140. The interlayer insulating layer 160 may include, for example, an inorganic insulating material such as the silicon nitride (SiNx), the silicon oxide (SiOx), or an organic insulating material.

The interlayer insulating layer 160 and/or the gate insulating layer 140 may include the contact hole 61 on the driving gate electrode 155*a*, the contact hole 62 on the source region connected to the channel region 131*b* of the second transistor T2, the contact hole 63 on the drain region connected to the channel region 131*c* of the third transistor T3 or the drain region connected to the channel region 131*d* of the fourth transistor T4, the contact hole 64 on the source region connected to the channel region 131*d* of the fourth transistor T4 or the drain region connected to the channel region 131*g* of the seventh transistor T7, the contact hole 65 on the source region connected to the channel region 131*e* of the fifth transistor T5, the contact hole 66 on the drain region connected to the channel region 131*f* of the sixth transistor T6, and the contact hole 68 on the connecting member 154.

A data conductor (including the data line 171, the driving voltage line 172 including the expansion part 178, and a plurality of connecting members 174, 175, and 179) is on the interlayer insulating layer 160. The data conductor may include a metal such as copper (Cu), aluminum (Al), molybdenum (Mo), or alloys thereof.

The data line 171 may be connected to the source region, which is connected to the channel region 131*b* of the second transistor T2 through the contact hole 62 in the gate insulating layer 140 and the interlayer insulating layer 160. Referring to FIG. 8, the data line 171 may overlap the shielding part 135 of the semiconductor member 130 via the interlayer insulating layer 160 and the gate insulating layer 140.

Referring to FIG. 6, the expansion part 178 of the driving voltage line 172 overlaps the driving gate electrode 155*a* via the interlayer insulating layer 160, to thereby form capacitor Cst.

Referring to FIG. 7, the connecting member 174 may be connected to the driving gate electrode 155*a* through the contact hole 61 and may be connected to the drain region connected to the channel region 131*c* of the third transistor T3 and the drain region connected to the channel region 131*d* of the fourth transistor T4 through the contact hole 63.

The connecting member 175 may be connected to the source region connected to the channel region 131*d* of the fourth transistor T4 and the drain region connected to the channel region 131*g* of the seventh transistor T7 through the contact hole 64.

Referring to FIG. 6, the connecting member 179 may be connected to the drain region connected to the channel region 131*f* of the sixth transistor T6 through the contact hole 66.

A passivation layer 180 is on the data conductor and the interlayer insulating layer 160. The passivation layer 180 may include an organic insulating material (e.g., a polyacrylate resin and a polyimide resin). An upper surface of the passivation layer 180 may be substantially flat. The passivation layer 180 may include the contact hole 81 on the connecting member 179 and the contact hole 82 on the connecting member 175.

A pixel electrode 191 and an initialization voltage line 192 may be on the passivation layer 180. Referring to FIG. 6 and FIG. 7, the pixel electrode 191 may be connected to the connecting member 179 through the contact hole 81. The initialization voltage line 192 may be connected to the connecting member 175 through the contact hole 82.

A pixel defining layer (PDL) 350 may be on the passivation layer 180, the initialization voltage line 192, and the pixel electrode 191. The pixel defining layer 350 has an opening 351 on the pixel electrode 191.

An organic emission layer 370 is on the pixel electrode 191. In one embodiment, the organic emission layer 370 may be in the opening 351. A common electrode 270 is on the organic emission layer 370 and on the pixel defining layer 350, thereby extending throughout the plurality of pixels PX. The pixel electrode 191, organic emission layer 370, and common electrode 270 together form the organic light emitting diode OLED. An encapsulation layer protecting the organic light emitting diode OLED may be on the common electrode 270. The encapsulation layer may include, for example, an inorganic layer and an organic layer that are alternately deposited.

Figure 9:
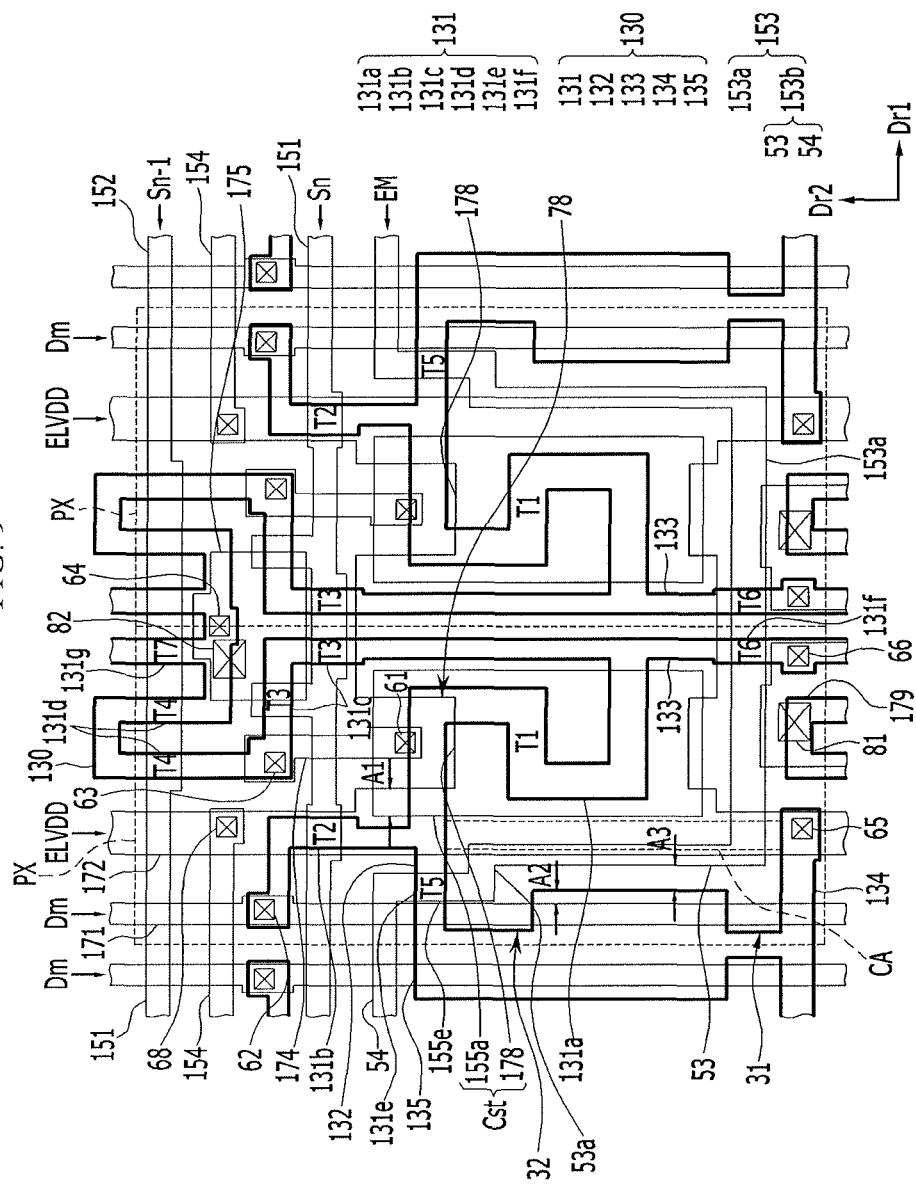
FIGS. 9 and 10 illustrate additional layout embodiments of adjacent pixels.

FIG. 9 illustrates another layout embodiment of two adjacent pixels of a display device. Referring to FIG. 9, the display device may be the same as the display device in FIGS. 4 to 8, except for the shape of the channel region 131*a* of the first transistor T1 in a plan view. For example, the channel region 131*a* of the first transistor T1 may have an approximate "S" shape or a reversed "S" shape.

In the present exemplary embodiment, the semiconductor member 130 is also not under the connection part 132 connected to the channel region 131a of the semiconductor member 130 and between the channel region 131a and the shielding part 135. Accordingly, the space margin may increase for the first portion 53 in the detour portion 153b of the control line 153, and the interval A3 between the first portion 53 of the control line 153 and the shielding part 135 may be sufficiently obtained.

Also, the width of the driving gate electrode 155a in the first direction Dr1 may be further extended to allow the width of the overlapping region of the driving gate electrode 155a and the expansion part 178 to be increased. For example, the width A1 of the first direction Dr1, of the portion where the driving gate electrode 155a overlaps the portion at the right and left of the recessed part 78 among the expansion part 178 of the driving voltage line 172, may be increased. As a result, deviation may not occur in the overlapping area of the driving gate electrode 155a and the expansion part 178 of the driving voltage line 172 by alignment error in the process. Accordingly, process margin may be sufficiently obtained and the display defect due to deviation of the capacitor Cst may be reduced.

Also, the overlapping margin of the shielding part 135 and the data line 171 (e.g., the width A2 in the first direction Dr1 of the remaining region outside the region overlapping the data line 171 among the shielding part 135) may be sufficiently obtained. Also, even if there is a process error, the risk of the data line 171 not being covered by the shielding part 135 may be reduced. This effect may be more particularly pronounced as the resolution of the display device increases. Other characteristics and effects may be the same as one or more of the above-described exemplary embodiments.

Figure 10:
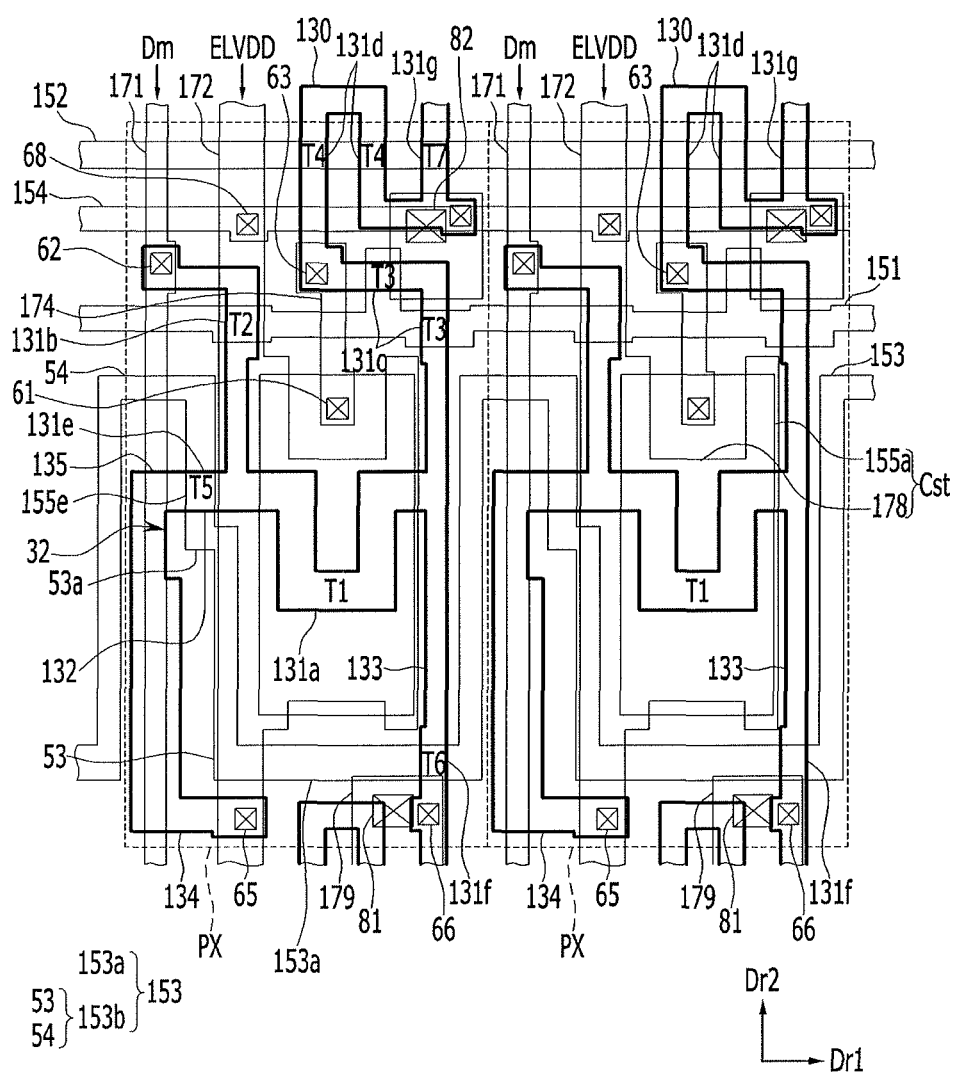

FIG. 10 illustrates another layout embodiment for two adjacent pixels of a display device. Referring to FIG. 10, the display device according to the present exemplary embodiment may be the same as the display device in FIGS. 4 to 8, except that two pixels PX adjacent in the first direction Dr1 do not form a symmetrical structure, but may have the same shape.

Accordingly, the expansion part 178 of the driving voltage line 172 in one pixel PX may be positioned to be limited to the region of the corresponding pixel PX. Also, the shielding part 135 of the semiconductor member 130 may overlap one data line 171 positioned between the two adjacent pixels PX.

The pitch, as a spatial cycle at which the control line 153 is bent, may be approximately the same as the width of one pixel PX in the first direction Dr1. For example, the distance between the center of the second portion 54 of one detour portion 153b of the control line 153 and the center of the second portion 54 of the adjacent detour portion 153b may be approximately the same as the width of one pixel PX in the first direction Dr1. Other characteristics and effects may be the same as one or more of the above-described exemplary embodiments.

Figure 11:
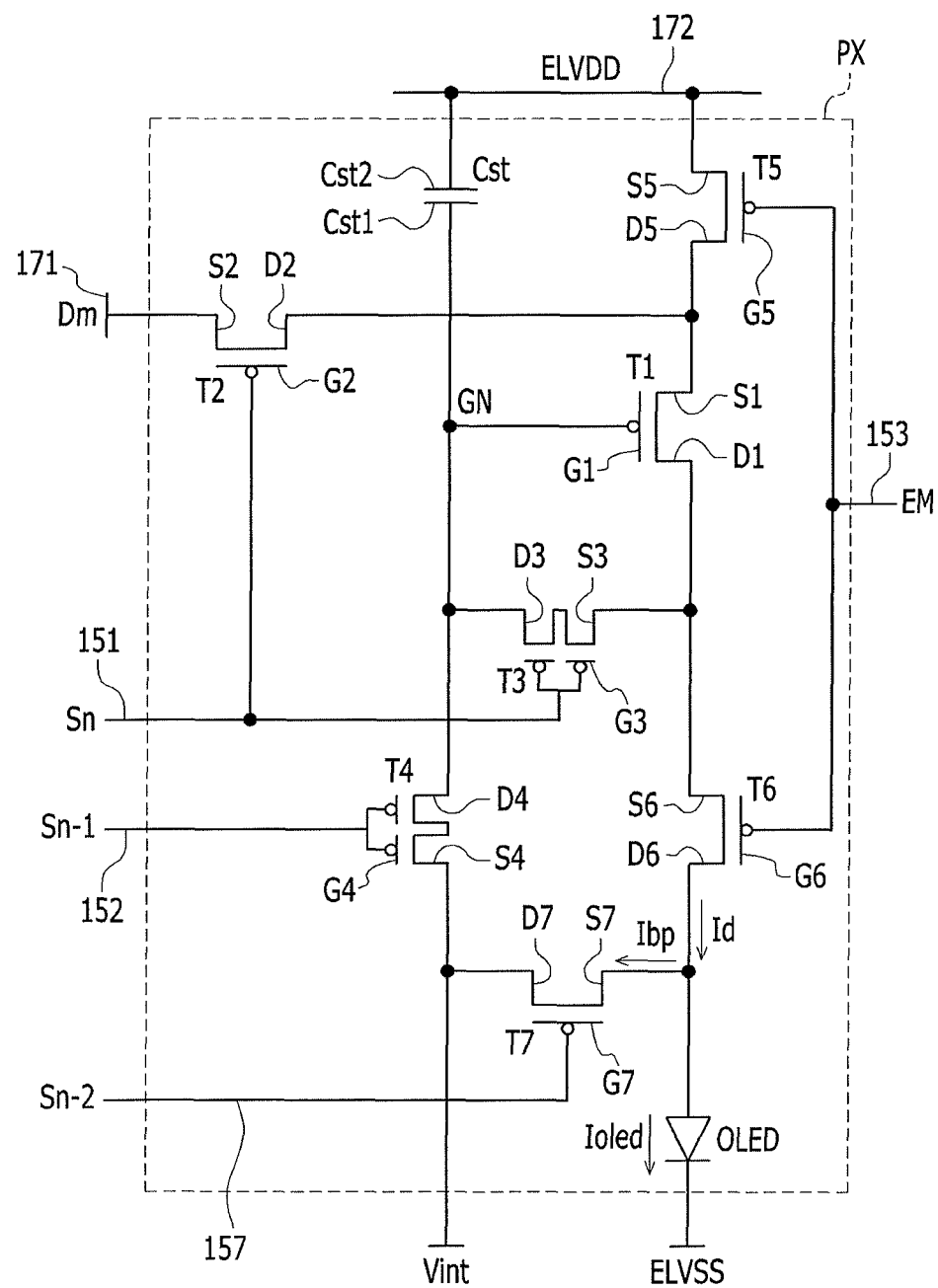
FIG. 11 illustrates another embodiment of a pixel.
Figure 12:
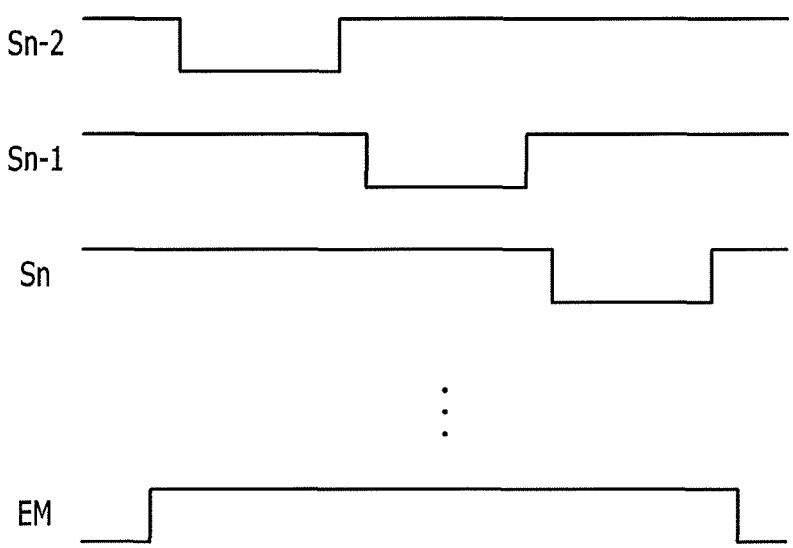
FIG. 12 illustrates another embodiment of a timing diagram for a pixel.

FIGS. 11 and 12 illustrate the structure and operation of another embodiment of a pixel according to an exemplary embodiment will be described with reference to FIG. 11 and FIG. 12. Referring to FIG. 11, the pixel may be the same as the pixel in FIG. 2, except that the plurality of signal lines connected to the pixel PX may further include a second previous scan line 157. Also, the gate electrode G7 of the seventh transistor T7 is not connected to the previous scan line 152, but may be connected to the second previous scan line 157. The second previous scan line 157 may transmit a second previous scan signal S(n−2) to the gate electrode G7 of the seventh transistor T7.

Referring to FIG. 12, operation of the pixel in FIG. 11 may be the same as in FIG. 3, except that in the initialization period, before the previous scan signal S(n−1) is supplied to the previous scan line 152, the second previous scan signal S(n−2) may be supplied to the second previous scan line 157 to turn on the seventh transistor T7. Thus, the initialization voltage Vint may be applied to the anode of the organic light emitting diode OLED through the turned-on seventh transistor T7.

Next, if the previous scan line 152 is applied with the previous scan signal S(n−1), the initialization voltage Vint is supplied to the gate electrode G1 of the first transistor T1 by the turned-on fourth transistor T4 such that the first transistor T1 may be initialized.

Figure 13:
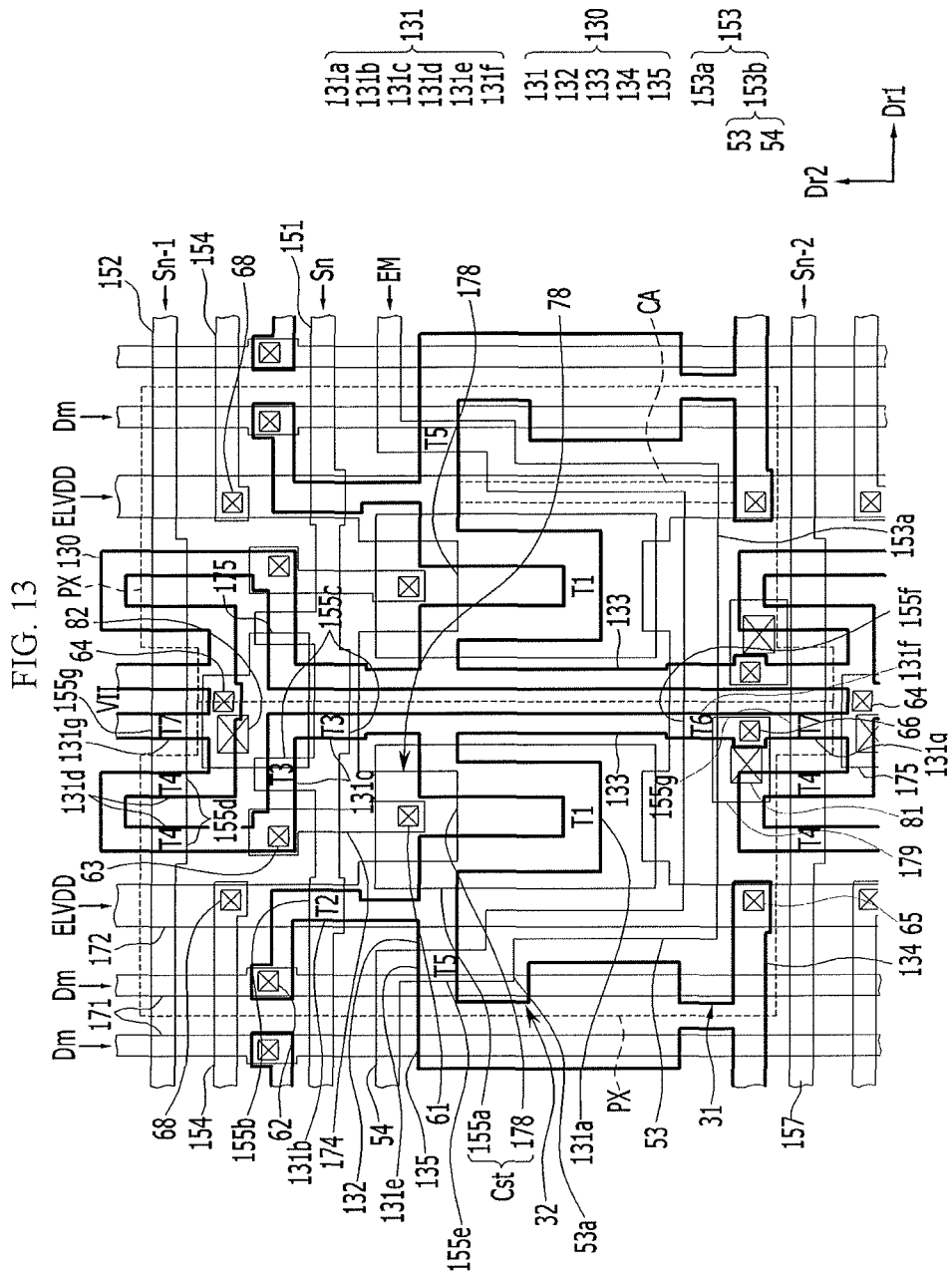
FIG. 13 illustrates another layout embodiment of adjacent pixels.
Figure 14:
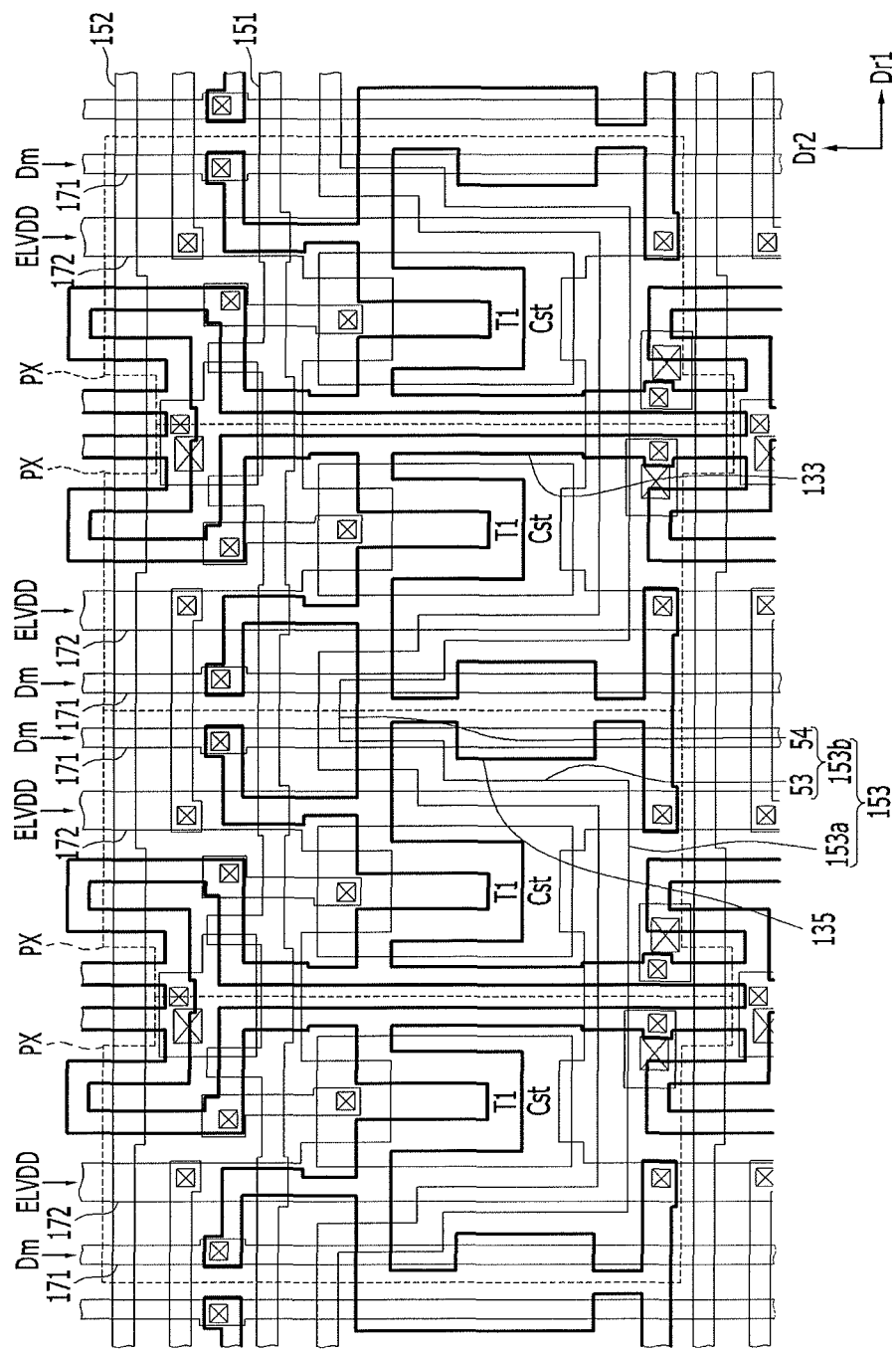
FIG. 14 illustrates another layout embodiment of adjacent pixels.

FIGS. 13 and 14 illustrate other embodiments of a display device, which, for example, may include pixels corresponding to FIGS. 11 and 12. Referring to FIG. 13 and FIG. 14, the display device may be the same as in FIGS. 4 to 8, except that one pixel PX may include a plurality of transistors T1, T2, T3, T4, T5, T6, and T7 and the capacitor Cst connected to the present scan line 151, the previous scan line 152, the second previous scan line 157, the control line 153, the data line 171, and the driving voltage line 172. The second previous scan line 157 may be under the control line 153.

The portion overlapping the semiconductor member 130 for the second previous scan line 157 may form the gate electrode 155g of the seventh transistor T7. The semiconductor member 130 overlapping the second previous scan line 157 may form the channel region 131g of the seventh transistor T7. The conductive region of the semiconductor member 130, positioned downwardly with respect to the second previous scan line 157 as the drain region of the seventh transistor T7, is connected to the connecting member 175 through the contact hole 64. The conductive region of the semiconductor member 130, positioned upwardly with respect to the second previous scan line 157 as the source region of the seventh transistor T7, is connected to the drain region of the sixth transistor T6 and is connected to the connecting member 179 through the contact hole 66. Other characteristics may be the same as previous embodiments.

Figure 15:
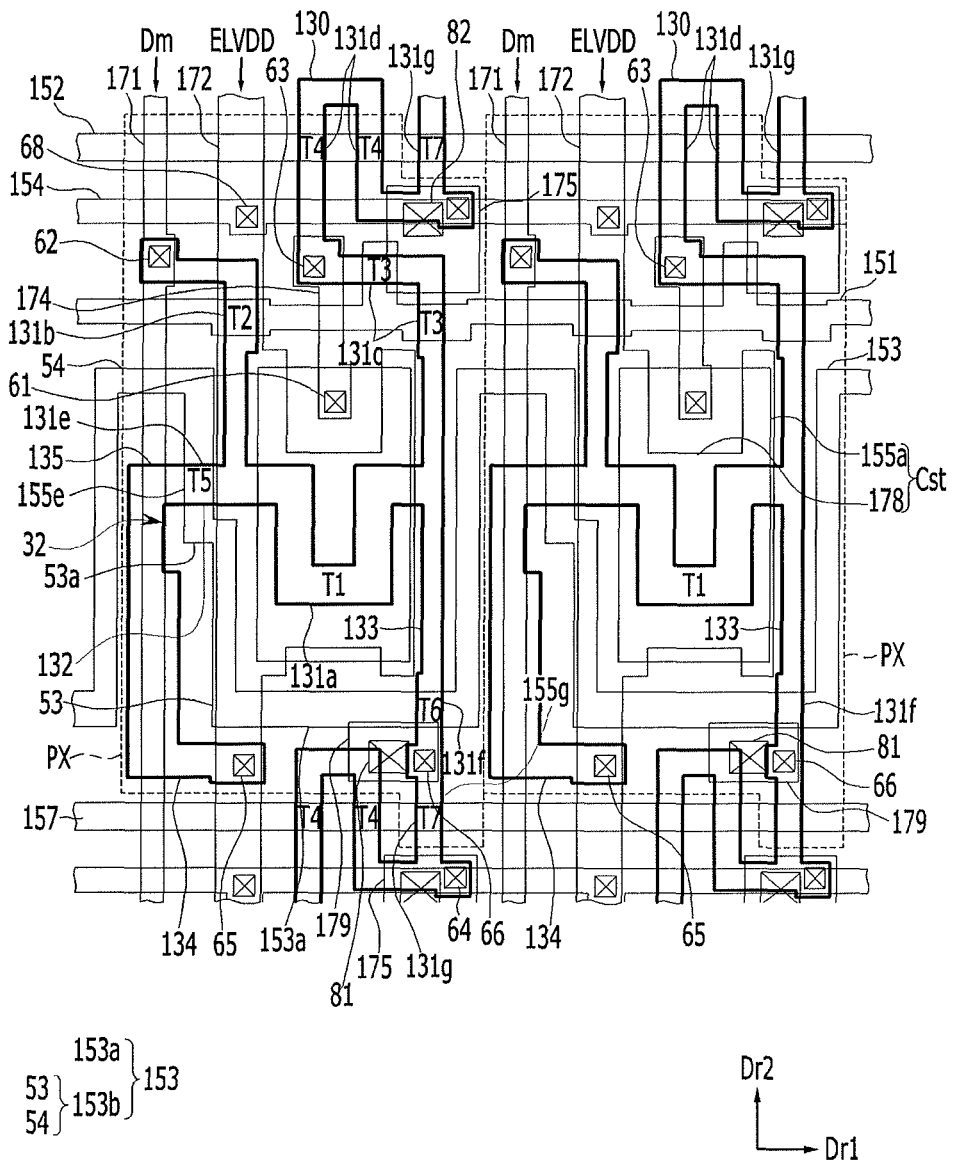
FIG. 15 illustrates another layout embodiment of adjacent pixels.

FIG. 15 illustrates another embodiment of a display device which may be same as the display device in FIGS. 13 and 14, except that two pixels PX adjacent in the first direction Dr1 are not in a symmetrical structure, but have the same shape in a plan view.

Example embodiments have been disclosed herein, and although specific terms are employed, they are used and are to be interpreted in a generic and descriptive sense only and not for purpose of limitation. In some instances, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:
1. A display device, comprising:
a driving gate electrode;
a scan line being spaced apart from the driving gate electrode and extending in a first direction;

a first data line to transmit a data signal, the first data line crossing the scan line;

a driving voltage line to transmit a driving voltage, the driving voltage line crossing the scan line;

a semiconductor area including a first channel region overlapping the driving gate electrode and a shielding area overlapping the first data line; and a control line including a main line portion and a detour portion, the main line portion extending in the first direction and the detour portion including a first portion extending in a second direction crossing the first direction, wherein the semiconductor area includes a second channel region overlapping the first portion of the detour portion, and wherein the first portion of the detour portion is disposed between a first side of the driving gate electrode extending in the second direction and the first data line.

2. The display device as claimed in claim 1, wherein:
the semiconductor area includes a first connector connecting the shielding area and the first channel region and including the second channel region, and
the first connector crosses the first portion of the detour portion.

3. The display device as claimed in claim 2, wherein the shielding area is connected to the driving voltage line and is to receive a driving voltage.

4. The display device as claimed in claim 3, wherein the first portion of the detour portion includes a portion between the shielding area and the driving gate electrode.

5. The display device as claimed in claim 4, wherein the first portion of the detour portion includes a bent area that includes at least one bend.

6. The display device as claimed in claim 5, wherein the shielding area includes a recessed area adjacent to the bent area.

7. The display device as claimed in claim 5, wherein the detour portion includes a second portion connected to the first portion of the detour portion and extending in the first direction.

8. The display device as claimed in claim 7, wherein the second channel region is between the bent area of the detour portion and the second portion of the detour portion.

9. The display device as claimed in claim 7, wherein the second portion of the detour portion is between the shielding area and the scan line.

10. The display device as claimed in claim 7, wherein the second portion of the detour portion crosses the first data line.

11. The display device as claimed in claim 3, wherein:
the semiconductor area includes a second connector connected to the shielding area, and
the driving voltage line is connected to the second connector through a contact hole of an insulating layer located between the second connector and the driving voltage line.

12. The display device as claimed in claim 1, wherein the driving gate electrode is between the scan line and the main line portion of the control line.

13. The display device as claimed in claim 1, wherein:
the driving voltage line includes an expansion area extending in the first direction, the expansion area overlapping the driving gate electrode to form a capacitor.

14. The display device as claimed in claim 13, further comprising:
a second data line adjacent to the first data line,
wherein the shielding area overlaps the first and second data lines.

15. The display device as claimed in claim 13, further comprising:
a third data line extending parallel to the first data line; and
another driving voltage line extending parallel to the driving voltage line,
wherein the driving gate electrode in a first pixel and another driving gate electrode in a second pixel are between the first data line and the third data line, and
wherein the expansion area of the driving voltage line and another expansion area of the another driving voltage line are connected to each other.

16. The display device as claimed in claim 1, wherein the detour portion includes a portion extending along a periphery of the shielding area and separated from the shielding area.

17. The display device as claimed in claim 1, wherein:
the shielding area includes a recessed area that does not overlap the first data line, and
the recessed area is adjacent to the main line portion in the first direction.

18. The display device as claimed in claim 1, wherein:
the semiconductor area includes a longitudinal part at a side opposite to the second channel region with respect to the driving gate electrode, and
the longitudinal part includes a portion crossing the main line portion.

* * * * *